United States Patent [19]

Gordon

[11] Patent Number: 5,747,740

[45] Date of Patent: May 5, 1998

[54] HELICAL SURFACE-MOUNTED TEST POINT

[76] Inventor: William H. Gordon, 8 Maple La., Mine Hill, N.J. 07801

[21] Appl. No.: 636,527

[22] Filed: Apr. 23, 1996

[51] Int. Cl.[6] .............................. H01B 1/02; H01R 9/00
[52] U.S. Cl. .................... 174/68.1; 174/94 R; 29/874; 439/83
[58] Field of Search .................... 174/94 R, 68.1; 228/104; 29/874; 439/884, 78, 83

[56] References Cited

U.S. PATENT DOCUMENTS

| | | | |
|---|---|---|---|
| 2,371,446 | 3/1945 | Jensen | 439/812 |
| 2,568,242 | 9/1951 | Matteson, Jr. | 200/262 |
| 3,269,805 | 8/1966 | Evans | 428/596 |
| 4,629,278 | 12/1986 | Norton et al. | 439/570 |
| 5,476,398 | 12/1995 | De Givry et al. | 439/841 |

FOREIGN PATENT DOCUMENTS 2279512  4/1995  United Kingdom ............ 439/83

*Primary Examiner*—Kristine L. Kincaid
*Assistant Examiner*—Kamand Cuneo
*Attorney, Agent, or Firm*—Donald P. Gillette

[57] ABSTRACT

A continuous wire loop test point to be soldered to a substrate includes five portions of a single length of wire bent to form more than a single turn of a generally helical loop. The central portion of the length of wire lies in a first plane and constitutes a bridging section. The two portions of the wire at the opposite ends of the bridging section are bent away from the first plane and are referred to as support sections because they support the bridging section after the loop is completed and is mounted on a substrate. The two end portions of the wire that extend from the ends of the support sections are bent inwardly to form a base section beneath the bridging section. These end portions extend generally toward each other diverge but at enough of an angle so that their tips do not meet but extend past each other. As a result, the maximum width of the base section, measured from the outer edge of one of the end portions to the outer edge of the other end portion is greater than the width of the bridging section, measured perpendicularly to wire forming that section. This provides a structure that is more stable standing on the base section than on any other section when placed on a substrate to be soldered to it.

15 Claims, 2 Drawing Sheets

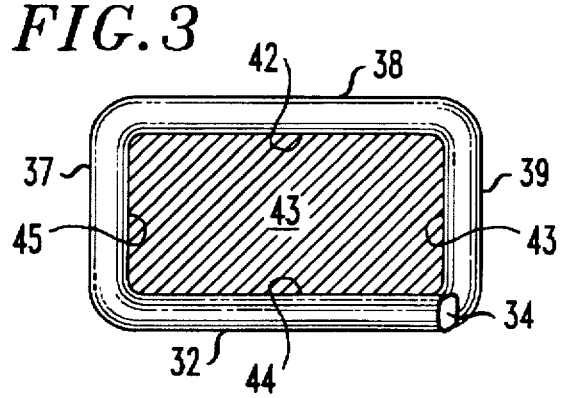
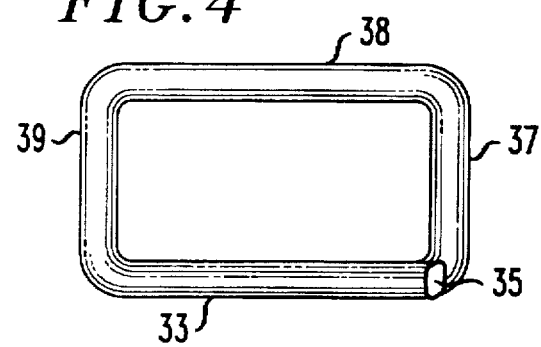
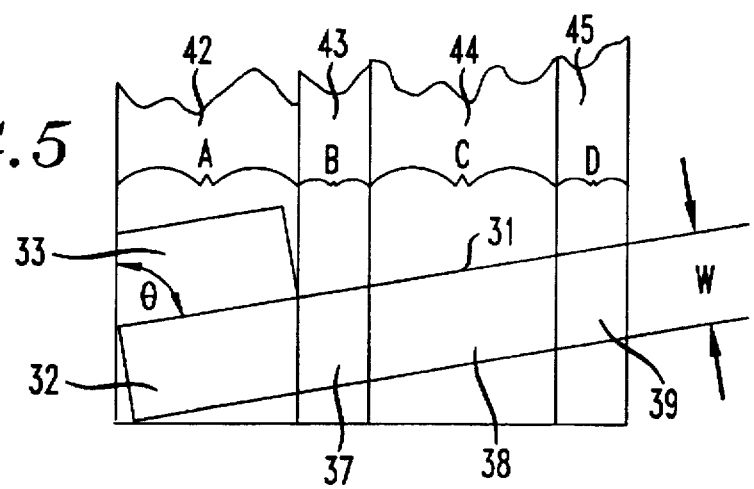
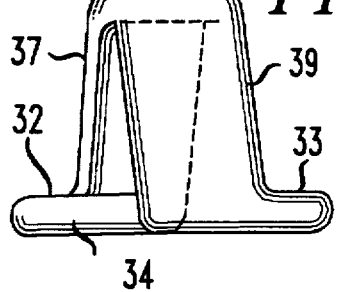
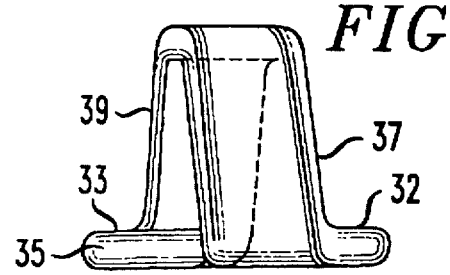
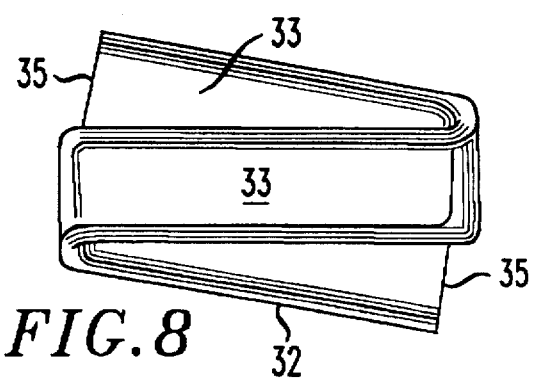
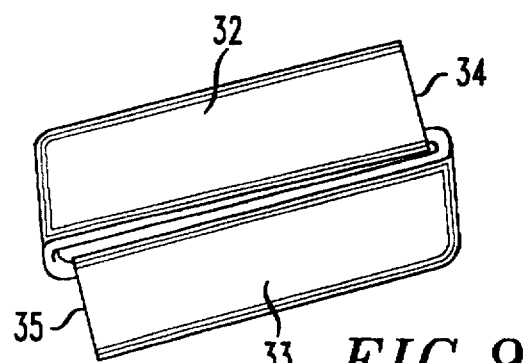

HELICAL SURFACE-MOUNTED TEST POINT

BACKGROUND OF THE INVENTION

This invention relates to devices known as test points for use on printed circuit substrates and particularly on substrates that use surface-mounted devices.

In testing and adjusting electronic circuits, it is necessary to attach meters, oscilloscopes, and other measuring devices to specific locations in the circuit. When such circuits were made of individual components, such as resistors, capacitors, vacuum tubes, and other devices connected together by visible and usually bare leads, it was relatively simple to determine where to connect the measuring devices, usually by touching the conductive tip of a pencil-shaped probe to the desired point or sometimes by connecting the measuring device by means of a small, spring-biased clip to the desired point. In either case, it was usually relatively easy to locate the point by visually following connecting leads in the circuit or by color-coding the leads or components or by using other legible indicia.

With the advent of printed-circuit boards in which the connections from one component to the next were made by etched conductive paths formed on the surface of a substrate by a photographic process, the connections from one component to another resembled each other and were frequently not easy to identify visually. This difficulty increased as components became smaller and were enclosed in structures that resembled one another and were connected together by leads sandwiched between substrates in multi-layer printed-circuit boards.

A popular solution for locating the points to which measuring devices were to be connected was to attach conductive devices at specific locations on the printed circuits to serve as test points. As originally used, the test points, like the leads for other circuit components, were mounted in holes drilled through the substrate. The common practice was and still is to form a conductive pad around such holes and to plate a conductive layer along the interior wall of each hole to join the conductive pads on opposite sides of the substrate. The conductive wire lead for a component or a test point was then inserted in the hole and soldered to the conductive material surrounding and extending through the hole.

More recently, electronic components that do not use through-hole conductors have come into use. These components use short leads that rest on conductive pads on the surface of the substrate and are soldered to those pads. While it is still sometimes necessary to drill and conductively plate some holes through the substrate, or layers thereof, to make connection to parts of the circuit on the other surface or on interior layers of a multi-layer structure, the number of such plated holes, which are called vias, has been considerably reduced, with an accompanying reduction in the cost of producing a finished printed-circuit board. However, this makes the use of a hole-mounted test point less desirable.

Objects and Summary of the Invention

It is one of the objects of this invention to provide a test point suitable for being surface-mounted.

As a further means of reducing the cost of producing completed printed-circuit boards with all of the components mounted thereon and soldered in place, automatic machines to place the components at precise positions on the boards have come into use. These machines have the components mounted on reels of film, somewhat like motion picture film. The film is deformed to create pockets to hold individual components that are precisely oriented and spaced precise distances apart, and each component is held in its respective pocket by a second ribbon of a different kind of film. The substrate on which conductive paths and pads have been formed has a tacky solder paste applied to the pads, and the substrate is precisely placed so that the reel of components is directly aligned with the appropriate pads. The machine then extracts a component from its pocket and places it on the proper pads, and the substrate and the same or another reel are indexed into a different alignment to allow the next component to be placed on the tacky pads intended for it. After a predetermined number of the components have been thus temporarily mounted on the substrate, appropriate parts of the structure are heated, such as by concentrated infra-red beams, and solder on the metal pads or the components or both is melted into integral union.

It is essential that each component remain in the position in which it is placed as it is extracted from the reel. It must not tip over.

Accordingly, it is another object of this invention to provide a test point that has a low center of gravity and a broad base to make it stable prior to the time of being joined by solder to the printed circuit.

In making connection to printed circuits, it is common to use probes that have small hooks at their ends to hold them in place while the person adjusting or testing the circuit is making other connections or is operating the controls of the testing device.

It is, therefore, another object of the invention to provide a surface-mountable test point capable of receiving a hook of the type used in measuring and testing devices.

It is a further object to provide a test-point with a base area of sufficient size to be joined to the printed circuit by a solder joint of sufficient area to hold the test point in place against a force of several pounds, such as might be exerted on it by a test probe or another device.

Further objects will become apparent to those skilled in the art after they have studied the following description, together with the accompanying drawings.

The test point of this invention is a wire loop of generally flattened, preferably rectangular shape so formed that beginning and ending sections of the wire lie alongside each other to form a base that is wider than other parts of the loop, thereby increasing the stability of the loop so that, when placed on a printed conductive pad, it does not fall over before being soldered to the pad. The side of the loop opposite the base bridges over the base and is integrally formed with the portions of the wire that extend up from each end of the base, and by making the beginning and ending sections of wire as long as the longest dimension of the loop, the center of gravity of the loop is closer to the base than to the opposite side. Having both the beginning and ending sections of the wire that constitute the base of the loop be equal in length to the longest dimension of the loop results in a larger area of contact with the printed circuit. This further helps to keep the loop from tipping over before it is soldered to the circuit and increases the cross section of the solder joint between the loop and the conductive pad.

The preferred wire used in forming the loop of this invention is flat wire, which has a cross section that is more than twice as wide in one direction as in the perpendicular direction. In forming the loop, the wider dimension of the flat wire is parallel to the base of the loop, further increasing the area of contact with the printed circuit for better electrical contact and stronger bonding.

In a preferred way of forming the test point, flat wire from a spool is fed into a receiving section of a four-slide machine at an angle suitable to form a generally helical loop around a mandrel of rectangular cross section. The end portion of a piece of the wire long enough to form the loop is gripped against the mandrel by the machine and is cut off from the spool. This end portion forms the initial part of the base of the loop. The cross-sectional shape of the mandrel defines the inner surface, or eye, of the loop, and successive slides of the machine press successive parts of the piece of wire toward each of the four sides of the mandrel in sequence to wrap the wire around the mandrel so that it conforms substantially to the rectangular shape of the mandrel. The wire is not initially held so as to be perpendicular to the mandrel but at an angle to it such that the final end section of the wire does not fall directly on top of the initial end section but lies directly alongside it.

The test point will be described in greater detail in the following description together with the drawings.

BRIEF DESCRIPTION OF THE DRAWINGS

FIG. 3 is a side view of the test point in FIG. 2 from the left side, also showing a mandrel on which the test point is formed.

FIG. 4 is a side view of the test point in FIG. 2 from the right side.

FIG. 5 illustrates the geometrical layout of the wire relative to the mandrel surfaces.

FIG. 6 is a side view of the test point in FIG. 2.

FIG. 7 is a side view of the test point in FIG. 2.

FIG. 8 is a top view of the test point in FIG. 2.

FIG. 9 is a bottom view of the test point in FIG. 2.

DESCRIPTION OF A PREFERRED EMBODIMENT OF THE INVENTION

Figure 1:
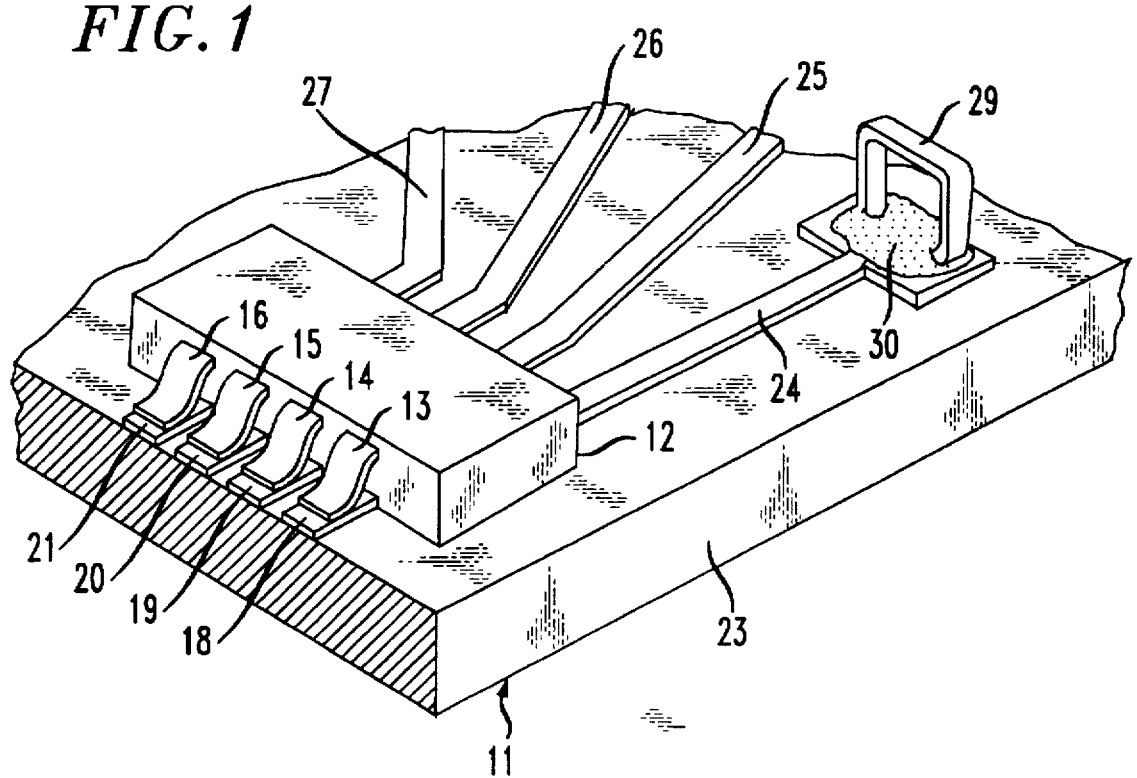
FIG. 1 is a perspective view of a fragment of a printed circuit including a test point according to this invention.

FIG. 1 shows a fragment of a printed circuit 11 that includes a surface-mounted integrated circuit, or i.c., 12 having terminals 13-16 soldered to conductors 18-21 formed on one surface of a substrate 23. There are several standard configurations of leads for surface-mounted devices: the one shown is known as a gull-wing lead and is the most commonly used type at the present time. Other types are a J-lead that extends straight down and then ends in a small hook that extends toward the surface-mounted device; a butt lead, which is frequently formed by cutting off a lead originally intended to extend through a hole; and a ball gate array, which resembles a tiny ball and is considered to have an advantage when connections are to be made with large number of terminals underneath an i.c. The gull-wing type is the easiest with which to make contact by means of a test probe with a sharp point. Some of the other types are completely covered by the component of which they are a part. Beyond just making contact, it is frequently desirable to have the test probe be attachable to the lead, and many leads have small hooks at one end to hook onto a lead from a component. It is difficult to use such probes with surface-mounted components, even those with gull-wing type leads, and it is impossible to make direct contact with leads hidden under the components, such as the ball array type.

In the case of an i.c. of the type indicated by reference numeral 12, there is typically a second set of terminals identical with the terminals 13-16 and symmetrical with those terminals but on the opposite side of the i.c. and, thus, out of sight in FIG. 1. They are soldered to printed conductors 24-27 that lead to other circuit components not shown in the drawing. The conductor 24 includes an enlarged area, or pad, 28, to which is soldered a test point 29 formed in the shape of a loop according to this invention. The loop in this embodiment has four sides, one of which will be referred to as a base that is completely covered by solder 30 shown as having hardened in place from the molten state. It can be seen that the solder forms excellent fillets all around the base immersed in it, thereby forming a strong bond between the loop 29 25 and the pad 28. The loop 29 is formed of flat wire 31 having a width of 0.040" and a thickness of 0.015" and, when well-bonded to the pad 28 by properly applied solder 30, and with the wider dimension of the wire facing the pad, can withstand a pull of about 16 lb. in the direction perpendicular to the surface of the 30 substrate 23.

Printed circuits using surface-mount technology are frequently assembled by machines, one part of which holds the substrate 23 in a specific position. The contact areas, such as the circuit conductors 18-21 and the pad 28, that are to receive the terminals of the components, such as the i.c. 12 and the test point loop 29, are prepared by having a small quantity of a mixture of paste and solder placed on them, sometimes through a mask having openings aligned with those areas. Another part of the machine then brings selected ones of the components, or a subset of them, into alignment with proper ones of the prepared contact areas and places the components on the sticky substance. In due time, the coated areas are heated to melt the solder and are then allowed to cool so that the solder can resolidify, joining each contact area of each component to the respective circuit area for which it is intended. Prior to the time the mixture on test point pads, such as the pad 28, are thus treated so that the solder on them can permanently grasp the respective test points, it is relatively easy for one or more of the test points to shift out of position or to topple over, and the structural features of the loop 29 about to be described are arranged to make it stable and to prevent its falling over while it is still free to do so.

Figure 2:
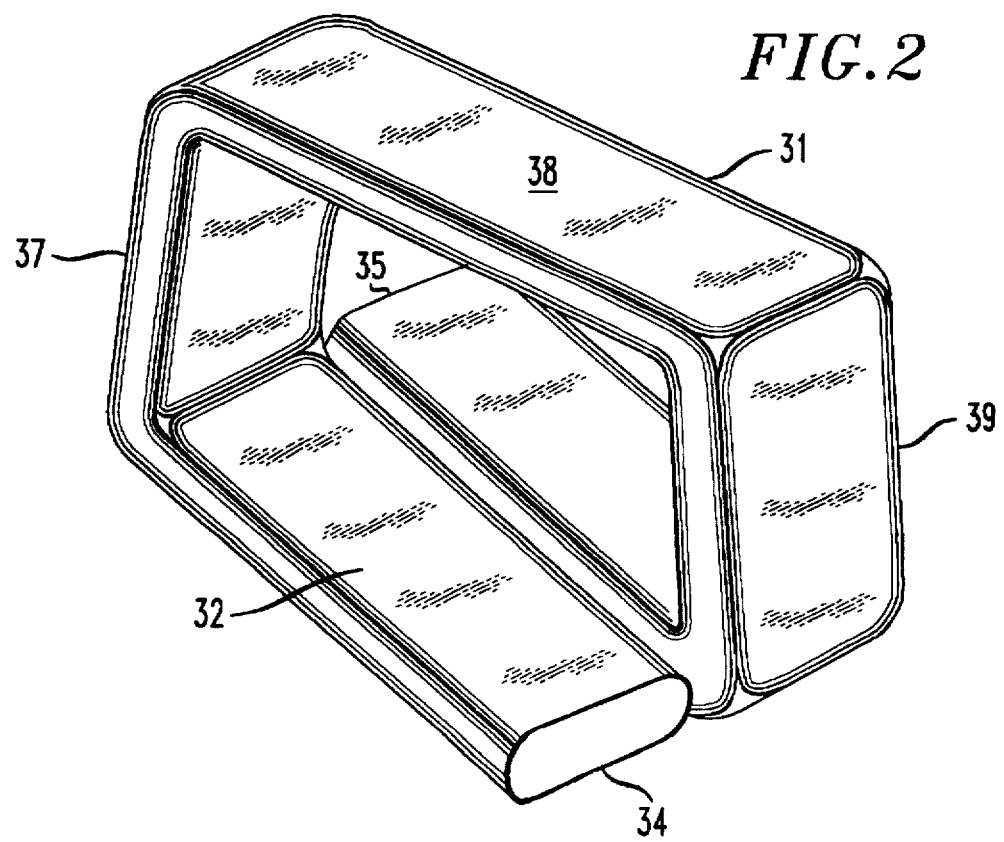
FIG. 2 is a perspective view of a test point according to this invention.

FIG. 2 is a greatly enlarged view of the loop 29 by itself. In this view, it can be seen that the wire 31 is flat wire bent to form into a generally rectangular loop having two end, or base, sections 32 and 33 that form the base of the loop and are located side by side close to, or in contact with, each other. For convenience, the section 32 will be referred to as the first base section, meaning that is the first section of the loop to be formed, and section 33 will be referred to as the last base section, meaning that it is the last section to be formed. The wire 31 is originally straight just prior to being bent into a loop, and the tips 34 and 35 of the base sections 32 and 33, respectively, are cut off perpendicular to the longitudinal dimension of that straight wire. At the other end of the base section 32 from the tip 34, the wire 31 is bent fairly sharply to define one support section 37 that extends upwardly from the base to one end of a bridging section 38 of the loop. The intersection of the bridging section with the support section 37 is defined by another relatively sharp bend, preferably of about 90° and, in any event, of an angle that makes the bridging section parallel to the base defined by the sections 32 and 33. At the other end of the bridging section, the wire 31 is again bent fairly sharply to extend downwardly toward the end section 33. The part of the wire between the bridging section 38 and the end section 33 is a second support section 39. Each of the four bends at the corners of the loop are made to have an inner radius of about one-third the thickness of the wire 31, or about 0.005". While the wire, itself, may be made of several types of metal, half-hard phosphor bronze has been found to be particularly suitable. To make it suitable for soldering, it is plated with a layer of copper about 0.0001" thick, and that layer, in turn, is plated with another layer to improve its ability to be wet by molten solder. Typically, the latter layer is a standard tin-lead alloy and is about 0.0003" thick.

A preferred way of forming the loop 29 is to wind the wire 31 around a mandrel 41. As shown in FIG. 3, which is a view along the longitudinal direction of the mandrel and is a side view of the loop 29, the mandrel 41 has a cross-sectional shape bounded by two longer sides 42 and 44 and two shorter sides 43 and 45. In order for the two base sections 32 and 33 of the wire 31 to lie alongside each other without interference or overlap, the wire is not wound straight around the mandrel 41 in one plane but is wound at an angle such that each of the wire sections 32, 37, 38, 39, and 33 progresses just far enough along the mandrel so that the sections 32 and 33 can lie immediately adjacent each other. The result is 30 that the center of gravity of the loop 29 is closer to the base formed of the two sections 32 and 33 than it is to the single bridging section 38. The two sections 32 and 33 are substantially as long as the bridging section, and so, the total weight of the sections 32 and 33 is almost twice as much as the weight of the bridging section 38. However, the weights of the support sections 37 and 39 contribute to the total mass of the loop 29, and their centers of gravity are approximately midway between the base sections 32 and 33 and the bridging section 38, resulting in an overall center of gravity closer to the base sections 32 and 33 than to the bridging section. This low center of gravity, in addition to the fact that the tips 34 and 35 extend out to the side of the vertical central plane of the loop, makes the loop more stable when it is placed upright on the pad 28, as shown in FIG. 1, than if the center of gravity were higher and the tips 34 and 35 did not extend out to the sides.

FIG. 4 views the loop 29 from the side opposite that illustrated in FIG. 3. In addition, the loop 29 in FIG. 4 is not on the mandrel 41. In order to make the eye 46 of the loop large enough to accept test probe hooks of the types currently in use, the dimensions are preferably about 0.130"× 0.060". Making the loop out of flat wire having a thickness of 0.015" makes the external dimensions about 0.160"× 0.090", although it is to be understood that none of these specific dimensions are to be considered as limiting the invention.

FIG. 5 illustrates the geometrical arrangement of the wire 31 relative to the mandrel 41. In this figure, the four surfaces 42, 44, 43, and 45 of the mandrel are represented as being laid out, or developed, in a single plane, as is the wire 31. The wire must be placed at an angle Θ to the mandrel's longitudinal direction, which is represented by the vertical lines that correspond to the intersections of the four surfaces such that:

$$\cot \Theta \approx \frac{A+B+C+D}{W}$$

where:

A is the width of the surface 42,
B is the width of the surface 43,
C is the width of the surface 44, and
D is the width of the surface 45.

By winding the wire 31 around the mandrel at the angle Θ, starting with the first base section 32 against the flat surface 42, followed by the section 37 against the surface 43, the section 38 against the surface 44, the section 39 against the surface 45, and, finally, the section 33 against the surface 42, the section 33 will lie directly alongside the starting section 32. In addition, for a mandrel having a rectangular cross section, as the mandrel 41 does, the distance A is equal to the distance C and the distance B is equal to the distance D, so the approximation of cot Θ can be simplified to $$\cot \Theta \approx \frac{2(A+B)}{W}$$

FIGS. 6 and 7 show how the tips 34 and 35 of the base sections 32 and 33 extend out to the sides of the bridging section 38 by a distance almost equal to the width of the bridging section, thereby helping to stabilize the loop 29 when it is placed on a substrate and before it is soldered permanently in place. The footprint of the loop, formed by the base sections, has twice the area it would have if the ends of the loop 29 were in line with each other, which gives a greater area of contact with the pad 28 and increases the cross section of the solder bond 30.

FIGS. 8 and 9 also show the tips of the base sections extending out to the sides of the loop. In addition, FIGS. 8 and 9 show the slope of the support sections 37 and 39 due to the angled winding of the wire 31 around the mandrel 41. By having two lengths of the wire 31 for the base sections 32 and 33 and only one length of the wire for the bridging section 38, twice as much of the mass of the loop is located in the base section as in the bridging section, thus holding the center of gravity closer to the base than to the top of the loop. The loop 29 is further stabilized by the fact that lowermost surfaces 47 and 48 of the base sections 32 and 33, respectively, are substantially co-planar. Arranging the two base sections 32 and 33 so that they lie side by side makes the narrowest dimension of the base equal to twice the width of the wire 31 and making each of these sections extend substantially the full distance from the supporting sections 37 and 39 results in their tips extending out to the sides of the loop 29 a distance approximately equal to the width of the wire 31, or about 1.5 times the width of the wire, as may be seen particularly in FIGS. 6 and 7.

Since the width of the flat wire is 0.040", making the overall height of the loop 29 0.09011, which is only a little more than twice the width of the wire, further stabilizes the loop. In this preferred embodiment, the center of gravity is less than half the height of the loop, which means that it is above the lowermost surface of the base sections by approximately the same distance as the outer edges of the base sections 32 and 33 from a central vertical plane through the center of gravity of the loop.

While this invention has been described in terms of specific embodiments, it is to be understood as including modifications thereof within the following claims.

What is claimed is:

1. A continuous wire loop for use as a test point for mounting on a solderable pad on a substrate, the wire loop comprising:
   (a) a substantially flat bridging section of the wire loop extending in a direction and having a certain minimum width and a certain length in said direction in a first plane;
   (b) first and second support sections of the wire loop bent downwardly from opposite ends of the bridging section and defining the maximum length of the loop in said direction; and
   (c) a base section comprising first and second end sections of the wire loop bent inwardly from lower ends of the support sections and extending in opposite directions alongside each other, whereby the base section has a minimum width greater than the minimum width of the bridging section, the end sections having lowermost surfaces that face away from the bridging section and lie in a second plane substantially parallel to the first plane to define a planar support for the test point, each of the end sections terminating in respective first and second ends pointing in opposite directions adjacent the second and first support sections, respectively.

2. The continuous wire loop for use as a test point of claim 1 in which the wire loop is flat wire having a cross-section, and said cross-section has a dimension in a first direction that is at least twice as great as a dimension in a second direction perpendicular to the first direction.

3. The continuous wire loop test point of claim 2 in which said dimension of the wire in the first direction is parallel to the base section.

4. The continuous wire loop test point of claim 3 in which the lowermost surface of the base system is substantially flat over substantially their entire lengths.

5. The continuous wire loop test point of claim 1 in which a major portion of each of the support sections is in a respective plane.

6. The continuous wire loop test point of claim 1 in which each of the support sections is in a respective plane substantially perpendicular to the base section.

7. The continuous wire loop test point of claim 6 in which the support respective planes are parallel to each other.

8. The continuous wire loop test point of claim 5 in which the end sections are substantially flat and parallel to the bridging section.

9. The continuous wire loop test point of claim 1 in which the length of each of the end sections is greater than half the length of the bridging section, whereby the loop has a center of gravity which is closer to the base section than to the bridging section.

10. The continuous wire loop test point of claim 9 in which the center of gravity is between one-third and one-half of the distance from the lowermost surface of the base section to the most distal surface of the bridging section.

11. A continuous wire loop test point for mounting on a solderable pad on a substrate, the loop wire comprising:
  (a) a base section comprising first and second end sections of the wire loop defining a planar support for the test point, each of the end sections extending alongside each other in opposite directions in a first plane and terminating in respective first and second ends pointing in opposite directions at first and second sides, respectively, of the base section;
  (b) first and second support sections of the wire loop extending upwardly from the first and second end sections at the second and first sides, respectively, of the base section; and
  (c) a bridging section of the wire loop integrally joining the first support section to the second support section and extending in a second plane substantially parallel to the first plane.

12. The continuous wire loop test point of claim 11 in which the wire loop is flat wire having a major cross-sectional dimension in a first direction that is at least twice as great as a minor cross-sectional dimension in a second direction perpendicular to the first direction.

13. The continuous wire loop test point of claim 11 in which the wire loop has a substantially helical, rectangular configuration.

14. The continuous wire loop test point of claim 13 in which the wire loop comprises a single turn plus the extent to which the end sections extend alongside each other.

15. The continuous wire loop test point of claim 14 in which the end sections are substantially contiguous along their respective lengths.

* * * * *